(12) United States Patent
Finocchiaro et al.

(10) Patent No.: US 9,191,072 B2
(45) Date of Patent: Nov. 17, 2015

(54) RF IDENTIFICATION DEVICE WITH NEAR-FIELD-COUPLED ANTENNA

(75) Inventors: Alessandro Finocchiaro, Catania (IT); Giovanni Girlando, Catania (IT); Giuseppe Palmisano, San Giovanni la Punta (IT); Giuseppe Ferla, Catania (IT); Alberto Pagani, Nova Milanese (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 13/415,693

(22) Filed: Mar. 8, 2012

(65) Prior Publication Data

US 2012/0168520 A1    Jul. 5, 2012

Related U.S. Application Data

(62) Division of application No. 12/182,893, filed on Jul. 30, 2008.

(30) Foreign Application Priority Data

Jul. 30, 2007   (IT) .............................. TO2007A0563

(51) Int. Cl.
*G08B 13/14*   (2006.01)
*H04B 5/00*    (2006.01)
(Continued)

(52) U.S. Cl.
CPC *H04B 5/00* (2013.01); *H01L 23/66* (2013.01); *H01L 24/73* (2013.01); *H01L 25/0655* (2013.01); *H01L 25/0657* (2013.01); *H01L 2223/6677* (2013.01); *H01L 2224/48091* (2013.01); *H01L 2225/06531* (2013.01); *H01L 2924/10253* (2013.01); *H01L 2924/1305* (2013.01); *H01L 2924/13091* (2013.01); *H01L 2924/3011* (2013.01); *H01L 2924/3025* (2013.01); *H01L 2924/30107* (2013.01);
(Continued)

(58) Field of Classification Search
CPC ............. H01L 2924/1305; H01L 2924/13091; H01L 2223/6677; H01L 25/0657; H01L 2225/06531; H01L 23/66; H01L 25/0655; H01L 24/73; H01L 2224/48091; H01L 2924/10253; H01L 2924/301; H04B 5/0037; H04B 5/00; H04B 5/0081; H04B 5/0031
USPC .......... 340/572.1–572.7, 10.1–10.5; 343/893; 235/375–385
See application file for complete search history.

(56) References Cited

U.S. PATENT DOCUMENTS 6,839,035 B1   1/2005  Addonisio et al.
2004/0001453 A1  1/2004  Kawai
(Continued)

*Primary Examiner* — Ojiako Nwugo
(74) *Attorney, Agent, or Firm* — Seed IP Law Group PLLC

(57) ABSTRACT

An embodiment of a RF identification device is formed by a tag and by a reader. The tag is formed by a processing circuit and a first antenna, which has the function both of transmitting and of receiving data. The reader is formed by a control circuit and by a second antenna, which has the function both of transmitting and of receiving data. The processing circuit is formed by a resonance capacitor, a modulator, a rectifier circuit, a charge-pump circuit and a detection circuit. The antenna of the tag and the processing circuit are integrated in a single structure in completely monolithic form. The first antenna has terminals connected to the input of the rectifier circuit, the output of which is connected to the charge-pump circuit. The charge-pump circuit has an output connected to the detection circuit.

16 Claims, 19 Drawing Sheets

(51) Int. Cl.
*H01L 23/66* (2006.01)
*H01L 25/065* (2006.01)
*H01L 23/00* (2006.01)

(52) U.S. Cl.
CPC ............ *H04B5/0031* (2013.01); *H04B 5/0037* (2013.01); *H04B 5/0081* (2013.01)

(56) References Cited

U.S. PATENT DOCUMENTS

| | | |
|---|---|---|
| 2006/0055541 A1* | 3/2006 | Bleckmann ................ 340/572.7 |
| 2006/0071084 A1* | 4/2006 | Detig et al. .................. 235/492 |
| 2006/0119534 A1 | 6/2006 | Semba et al. |
| 2006/0208899 A1 | 9/2006 | Suzuki et al. |
| 2007/0023517 A1* | 2/2007 | Tan et al. ...................... 235/435 |
| 2007/0141780 A1 | 6/2007 | Higashitani |
| 2007/0205946 A1 | 9/2007 | Buris et al. |
| 2007/0222602 A1* | 9/2007 | Luo et al. ................... 340/572.7 |
| 2007/0222603 A1* | 9/2007 | Lai et al. ................... 340/572.7 |
| 2008/0001577 A1 | 1/2008 | Sather |
| 2008/0158081 A1* | 7/2008 | Rofougaran .................... 343/787 |
| 2008/0259576 A1 | 10/2008 | Johnson et al. |
| 2009/0128289 A1* | 5/2009 | Rossman ..................... 340/10.1 |
| 2010/0013459 A1 | 1/2010 | Carmon et al. |
| 2010/0026454 A1* | 2/2010 | Rowse et al. ................ 340/10.1 |

\* cited by examiner

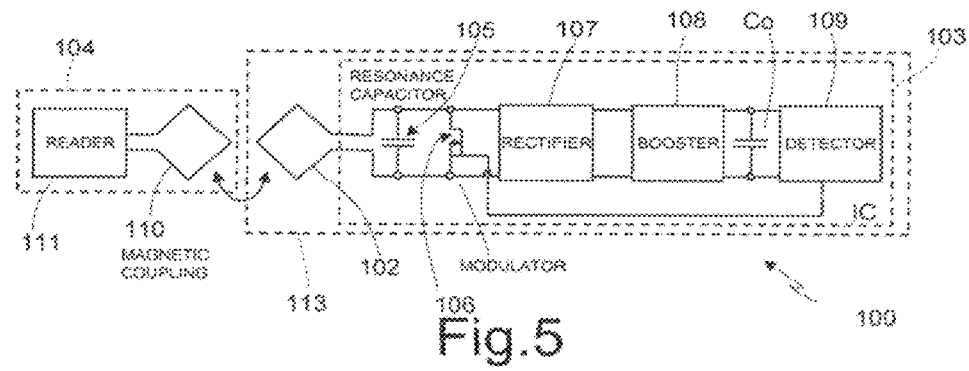
Fig.5
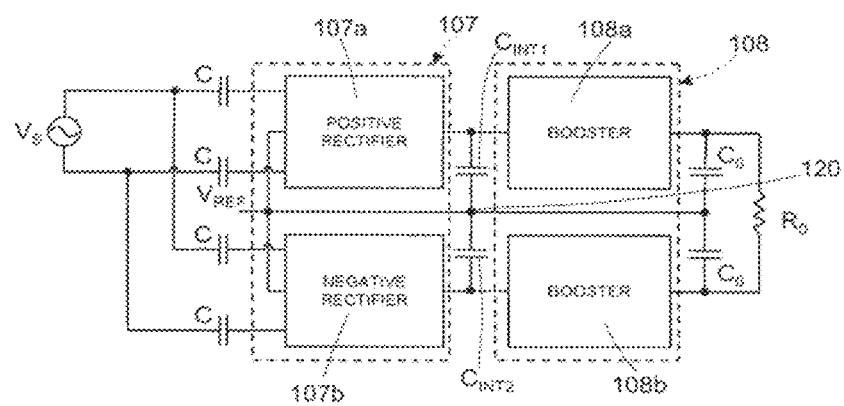
Fig.6
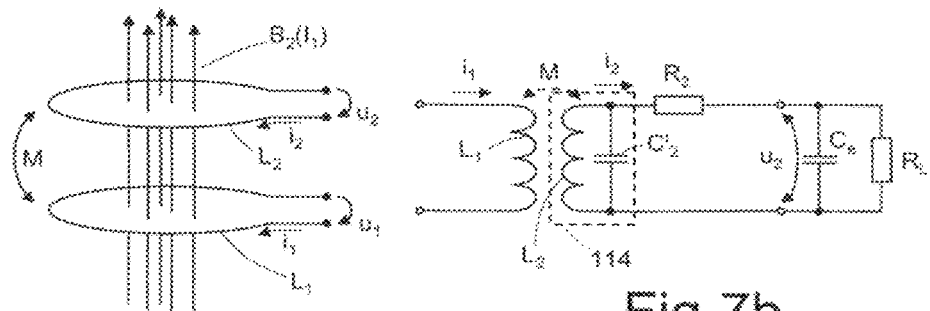
Fig.7a
Fig.7b

| | Q | $L_S$ | $f_{RS}$ |
|---|---|---|---|
| Occupied area ↑ | ↓ | ↑ | ↓ |
| Width ↑ | ↑↓ | ↓ | ↓ |
| Distance between turns ↑ | ↓ | ↓ | ↓ |
| Number of turns ↑ | ↓ | ↑ | ↓ |

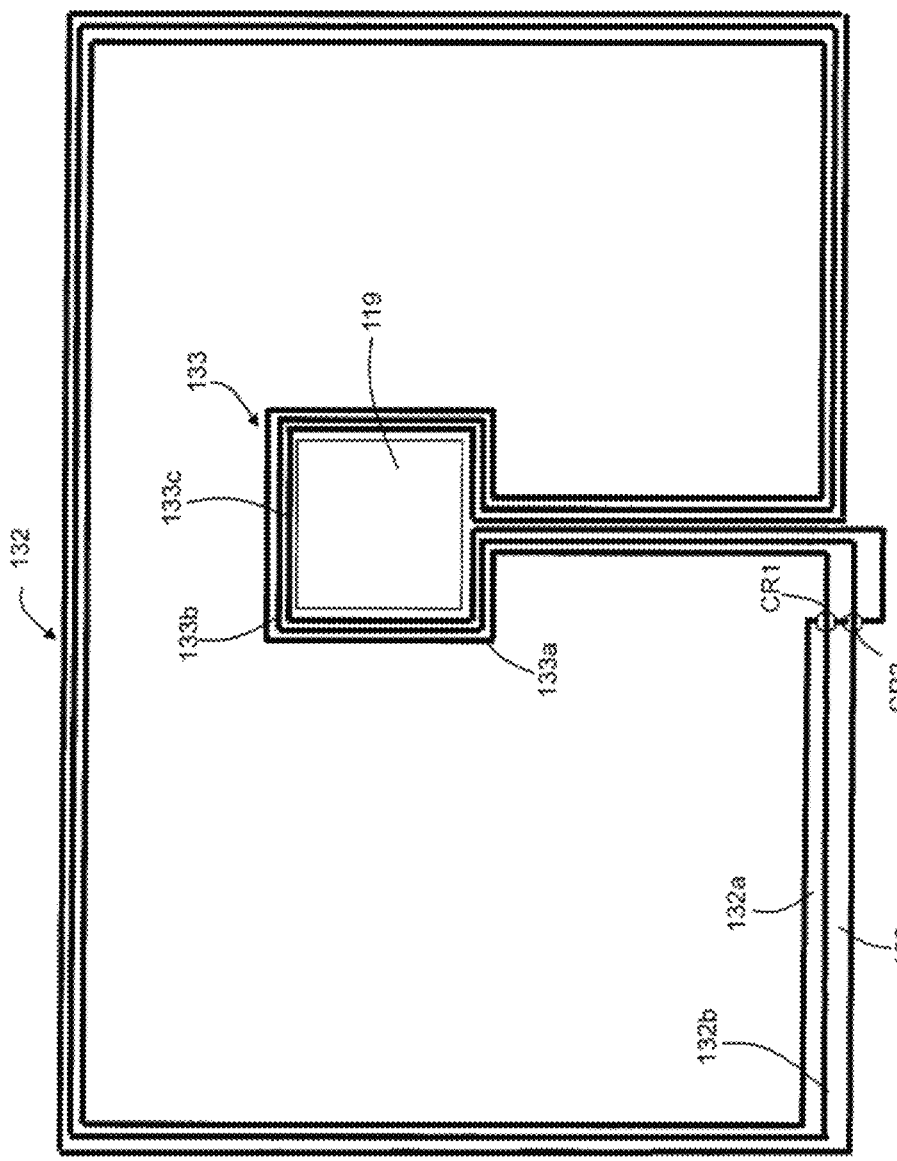

RF IDENTIFICATION DEVICE WITH NEAR-FIELD-COUPLED ANTENNA

PRIORITY CLAIM

This application claims priority from Italian patent application No. TO2007A000563, filed Jul. 30, 2007, and is a divisional of and claims priority from U.S. patent application Ser. No. 12/182,893, filed Jul. 30, 2008, which are incorporated herein by reference.

TECHNICAL FIELD

An embodiment of the present disclosure relates to a device for radiofrequency (RF) identification with near-field-coupled antenna. In particular, the device can be used in a wireless system for reading/writing data.

BACKGROUND

RF identification, known by the acronym RFID (Radio Frequency IDentification), is a technology for automatic identification of objects, animals, or persons. RFID systems are based upon remote reading/writing of information contained in a tag via RFID readers.

For a better understanding of these systems, reference may be made to FIG. 1, which shows the principle diagram of a wireless data-read system using a tag. As is shown, RFID tags 1 are formed by two main components: a first antenna 2 (which is both a receiving and a transmitting antenna) and a processing circuit 3. The manufacture of an RFID tag 1 currently available on the market typically requires two distinct manufacturing steps for providing the processing circuit 3, encapsulated in a purposely provided package, and for providing the first antenna 2. Then, the first antenna 2 is mounted on the processing circuit 3, and finally these are inserted in a containment structure designed to protect the first antenna 2 and the processing circuit 3 from the outside environment. Reading of the signal sent by the first antenna 2 of the RFID tag 1 is performed via a reader 4.

Typically the RFID tags/can operate in the HF or UHF bands. The RFID tags 1 operating in the HF band (typically at the standard frequency of 13.56 MHz) communicate with the respective reader 4 in near-field-coupling conditions, i.e., principally via magnetic coupling over very small distances, in the region of approximately ten centimeters. The antenna is in this case formed by a coil of conductor material enclosing an area equal to about ten square centimeters (FIG. 2).

FIG. 2 shows in greater detail the components of the processing circuit 3 of the RFID tag 1. The processing circuit 3 comprises, cascade-connected, a resonance capacitor 5, a modulator 6, a rectifier stage 7, a booster stage 8, and a detection circuit 9. The reader 4 comprises, instead, a second antenna 10 and a control circuit 11.

FIG. 3 shows an RFID tag 1, wherein the first antenna 2 is coupled in the UHF band with the second antenna 10 of the reader 4. Usually, this type of coupling is performed in far-field conditions so as to enable the reader 4 to detect the presence of the RFID tag 1 even at a large distance. Thus, the antennas used have linear dimensions at least on the order of centimeters.

The RFID tag 1 shown in FIG. 3 moreover has an adaptation network 12, arranged on the outside of the processing circuit 3.

In the devices of FIGS. 2 and 3, the rectifier stage 7 can be of any type, for example, of the PMOS-NMOS type with cross-connected gates shown in FIG. 4, which has been implemented in the solution proposed. In detail, the rectifier stage 7 is formed by a pair of PMOS transistors M2, M4 and a pair of NMOS transistors M1, M3, with cross-connected gates, operating as switches.

A voltage generator $V_s$ is coupled, at input terminals A, B, to the rectifier stage 7 and supplies an input square-wave signal $V_s$ having an amplitude such as to bring the transistors M1, M2, M3, M4 into a low-resistance "on" state (sometimes called the triode region) in the high condition of the wave and to inhibit them when the voltage is zero. In detail, during the half-period when the potential of the terminal A is positive with respect to the terminal B, M1 and M2 are on, while M3 and M4 are off. In this situation, a current Ic flows from a ground node GND through M1 to the voltage generator $V_s$ and then through M2 to a load represented in FIG. 4 by a resistor R0 and a capacitor C0.

During the half-period when the potential of the terminal A is negative with respect to the terminal B, the transistors M3 and M4 are on, while the transistors M1 and M2 are off. In this situation, the current Ic flows from ground through the transistor M3 to the voltage generator $V_s$ and then through the transistor M4 to the load R0, C0, and then recloses to ground. Consequently, in each of the two half-periods, the current Ic that flows in the load C0, R0 always has a same direction. The current Ic charges the capacitor C0, which functions as a battery for the circuits downstream. The rectifier stage 7 generates a d.c. voltage on the capacitor C0, given by the following equation:

$$V_{DC} = V_s - 2V_{on} \qquad (1)$$

where $V_s$ is the amplitude of the voltage input to the rectifier stage 7, and $V_{on}$ is the voltage across the drain and source of the MOS transistors M1-M4 due to the resistance of their respective channels, in a triode condition. When the current Ic increases, $V_{on}$ increases and $V_{DC}$ decreases for a given $V_s$ and a given channel resistance. The behavior of the rectifier stage 7 in the case of an input voltage $V_s$ of a sinusoidal type is similar to the one described above, but the d.c. voltage on the load R0, C0 as well as the electrical efficiency of the rectifier circuit 7 have a lower value, since the transistors affected (M1-M2 or M3-M4) remain on in the triode condition for a time shorter than a half-period of an input square wave at the same frequency.

Given the dimensions of the transmitting antennas 2, these often cannot be integrated in the processing circuit 3 in either of the devices shown in FIGS. 2 and 3, thus leading to a high production cost, represented by the large number of manufacturing steps, and large overall dimensions of the final device.

SUMMARY

An embodiment of the present disclosure is a near-field-coupling RFID tag, in which the processing circuit and the transmitting antenna are integrated in a completely monolithic single structure.

BRIEF DESCRIPTION OF THE DRAWINGS

One or more embodiments of the disclosure are now described, purely by way of non-limiting example and with reference to the attached drawings, wherein:

FIG. 5 shows a block diagram of an embodiment of the present disclosure;

FIG. 6 shows a circuit diagram of an embodiment of a component of the circuit of FIG. 5;

FIGS. 7a and 7b are schematic illustrations of the coupling between the antennas and the corresponding equivalent circuit according to an embodiment;

FIGS. 17a-17e show different top plan views of further embodiments of RFID TAGs;

FIGS. 21a-26a are top plan views of embodiments of integrated circuit-electromagnetic expansion arrangements;

FIGS. 21b-26b are lateral views of the embodiments of FIGS. 21a-26a;

DETAILED DESCRIPTION

Figure 1:
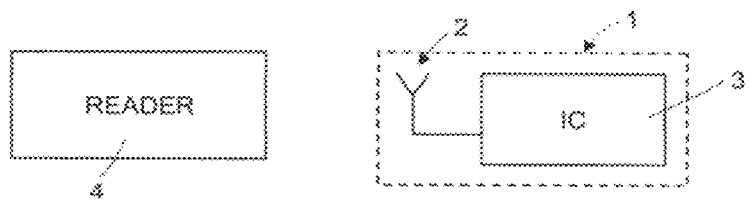
FIG. 1 shows a block diagram of an RFID tag and of the corresponding known reader.
Figure 2:
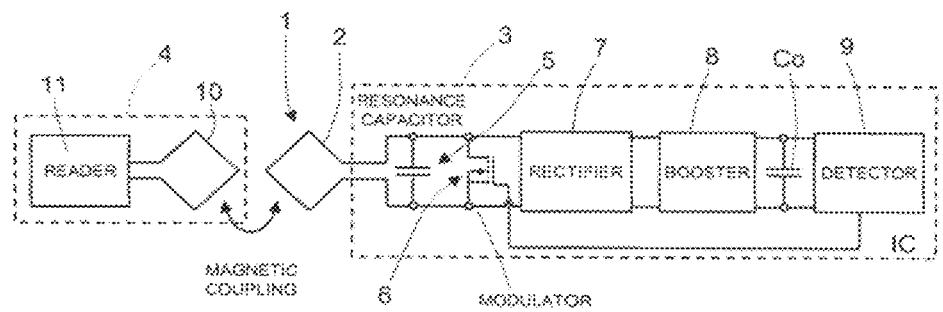
FIG. 2 shows a block diagram of an RFID tag of a known type.
Figure 3:
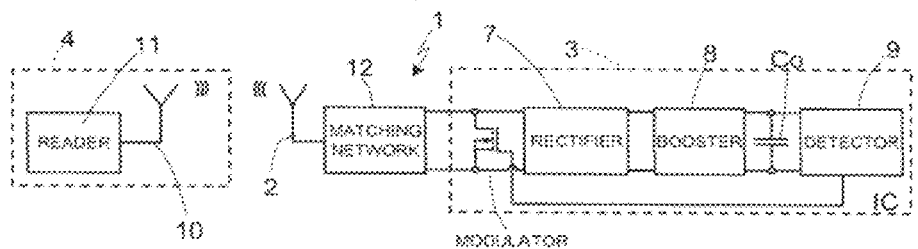
FIG. 3 shows a block diagram of another RFID tag of a known type.

FIG. 5 shows an embodiment of a RFID tag 100, comprising a processing circuit 103 and a first antenna 102, which are enclosed in a package 113. The first antenna 102 is electrically coupled to a resonance capacitor 105 arranged in parallel thereto; in turn, the terminals of the resonance capacitor 105 are coupled to the source and drain terminals of a MOS transistor forming a modulator 106. The gate terminal of the modulator 106 is coupled to a detection circuit 109. The detection circuit 109 is a digital block, which, according to the commands received from the reader 104, outputs the appropriate sequence of bits for driving the gate terminal of the modulator 106. The source and drain terminals of the modulator 106 are coupled also to a rectifier stage 107. A booster stage 108 is coupled between the outputs of the rectifier stage 107 and the input of the detection circuit 109.

The first antenna 102 is coupled to a receiving antenna 110 belonging to a reader 104 similar to the reader 4 of FIG. 1 and thus not described in detail hereinafter.

In order to double the d.c. voltage on the load R0, C0, maintaining the input voltage $V_s$ unaltered, the configuration illustrated in FIG. 6 has been used, wherein FIG. 6 illustrates in greater detail the connection between the rectifier stage 107 and the booster stage 108.

Figure 4:
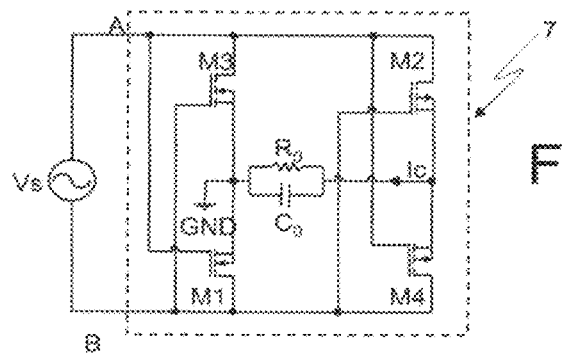
FIG. 4 shows a circuit diagram of a component of the block diagrams of FIGS. 2 and 3.

As is shown in the embodiment of FIG. 6, the booster stage 108 comprises a first booster circuit 108a and a second booster circuit 108b, coupled, respectively, to the outputs of a positive rectifier 107a and of a negative rectifier 107b, each of which operates in the same way as the rectifier stage 107 of FIG. 4. A first filter capacitor Cint1 and a second filter capacitor Cint2 are coupled between the booster circuits 108a and 108b and the positive and negative rectifiers 107a, 107b. The capacitors Cint1, Cint2 have a first terminal coupled to a common node 120 and a second terminal coupled to the outputs of the positive rectifier 107a and negative rectifier 107b. The common node 120 is coupled to an internal potential reference Vref.

Also the first and second booster (e.g., change-pump) circuits 108a and 108b are PMOS and NMOS circuits with cross-connected gates. These circuits, however, unlike the positive rectifier 107a and negative rectifier 107b, take the d.c. voltage present across the capacitors Cint1, Cint2 and output a voltage that is twice the input voltage. The resistor R0, having two terminals coupled respectively to the outputs of the first change-pump circuit 108a and of the second change-pump circuit 108b, represents the resistance seen at the terminals of the detection circuit 109.

Both the rectifier stage 107 and the booster stage 108 include MOS transistors similar to the MOS transistors M1-M4 shown in FIG. 4.

The structure of FIG. 6 has an advantage of reducing the increase in the total threshold voltage necessary for sending the MOS transistors into conduction, due to the cascade connection of the rectifier stage 107 and of the booster stage 108.

In particular, the threshold voltage is proportional to the square root of the voltage between the source terminal and the bulk terminal of the MOS transistors of the booster stage 108.

The voltage between the source terminal and bulk terminal of the MOS transistors of the booster stage 108 is proportional to the number of stages before the booster stage 108.

Consequently, with the structure of FIG. 6, the same voltage existing on the output terminals of the first and second charge-pump circuits 108a, 108b is applied on the output terminals of the booster stage 108, with a smaller number of stages. In particular, if N is the number of booster stages 108 necessary to generate an output voltage Vo, the number of charge-pump circuits 108a, 108b cascade-connected to the positive and negative rectifiers 107a, 107b, respectively, and necessary for producing the same output voltage Vo is equal to (N−1)/2.

In order to ensure proper operation of the first and second change-pump circuits 108a and 108b, the first antenna 102 supplies a minimum voltage VMIN=VTH+Vdiss, where VTH is the threshold voltage for the transistors M1-M4 and Vdiss is the voltage due to the current that flows in the internal resistance of the first antenna 102 during normal operation of the RFID tag 100. In general, simulations show that the amplitude of the input signal $V_s$, i.e., the voltage at the terminals of the first antenna 102, must be higher than about 400 mV.

The maximum distance between the RFID tag 100 and corresponding reader 104 which allows the first antenna 102 to supply a voltage equal to VMIN is referred to as "reading range" and is calculated as explained hereinafter, with reference to FIGS. 7a and 7b.

FIGS. 7a and 7b show, respectively, an embodiment of the coupling between a first coil L1 belonging to the second antenna 110 of the reader 104 and a second coil L2 belonging to the first antenna 102 and the corresponding equivalent circuit.

In detail, in FIG. 7b, the load resistor $R_L$ represents the parallel equivalent resistance of the processing circuit 103, as seen by the first antenna 102, hereinafter used for calculation of the reading range. The load resistor $R_L$ dissipates a power linked to the load voltage $u_2$ across the load resistance $R_L$ and given by the sum of three contributions: a first contribution is represented by the voltage generated by the coupling produced by the current on the coil L1 of the reader 104; a second contribution is given by the ohmic losses of the coil L2 of the RFID tag 100 through which a current $i_2$ flows (the losses being represented in FIG. 7b by a resistor R2 arranged in series to the coil L2); finally, a third contribution is due to the current that flows through the coil L2 of the RFID tag 100 and which generates a magnetic field opposite to the one generated by the reader 104. In practice, we have $$u_2 = \frac{d\Psi}{dt} = M\frac{di_1}{dt} - L\frac{di_2}{dt} - i_2 R_2 \quad (2)$$

where $\Psi$ is the magnetic flux traversing the coils L1 and L2, and M is the magnetic-coupling factor between the coils L1 and L2.

The voltage $u_2$ across $R_L$ is in general increased by adding a parallel capacitor $C_2^I$ coupled in parallel to the coil of the RFID tag 100 so as to form a parallel resonant circuit 114 at the operating frequency of the reader 104. The resonance frequency f of the parallel resonant circuit 114 is given by the following relation:

$$f = \frac{1}{2\pi\sqrt{L_2 C_2}} \quad (3)$$

where $C_2$ is given by the sum of the equivalent capacitance $C_{equ}$ at the input of the processing circuit 103 and of the capacitance $C_2^I$ of the parallel capacitor, as follows:

$$C_2 = C_{equ} + C_2^I \quad (4)$$

From Eqs. (2), (3) and (4), a minimum magnetic field $H_{min}$ is obtained, which produces a voltage $u_2$ equal to VMIN. This is given by:

$$H_{min} = \frac{u_2 \sqrt{\left(\frac{\omega L_2}{R_L} + \omega R_2 C_2^I\right)^2 + \left(1 - \omega^2 L_2 C_2^I + \frac{R_2}{R_L}\right)^2}}{\omega \mu_0 A N} \quad (5)$$

where A and N are, respectively, the area and the number of turns of the coil L2 of the RFID tag 100, and $\mu_0$ is the magnetic permeability in vacuum.

The relation that links the field $H_{min}$ to the reading range x is given by:

$$x = \sqrt{\sqrt[3]{\left(\frac{i_1 N_1 R^2}{2 H_{min}}\right)^2} - R^2} \quad (6)$$

where $i_1$ is the current that traverses the second antenna 110 of the reader 104, $N_1$ is the number of turns of the coil L1, and R is the radius of the receiving antenna 110 of the reader 104.

Figure 8:
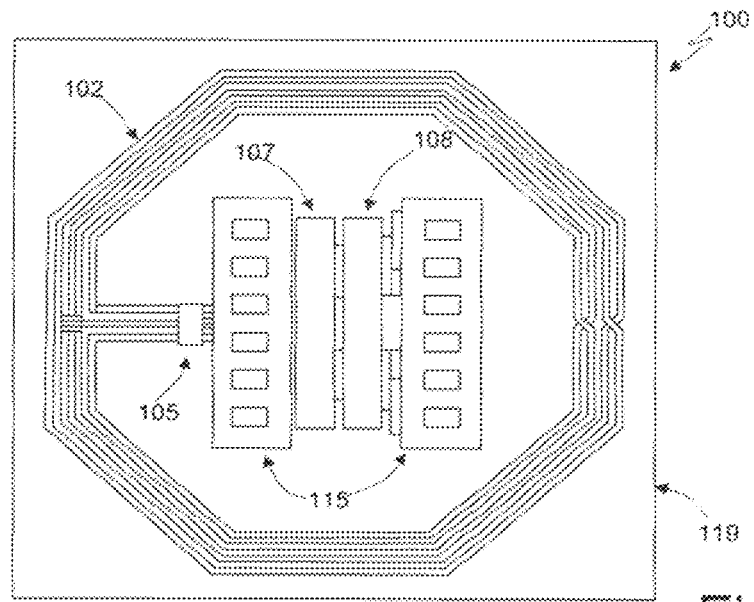
FIG. 8 shows the arrangement of the elements of a device according to an embodiment.

FIG. 8 shows the layout of an embodiment of the RFID tag 100, from which it is evident that all the components of the RFID tag 100, including test contacts 115, are arranged inside the first antenna 102, hence providing a considerable saving of semiconductor area. In this case, the area of the first antenna 102 is approximately 1 mm².

Moreover FIG. 8 shows also the resonance capacitor 105, the rectifier stage 107, the booster stage 108, and the plurality of test contacts 115.

Figure 9:
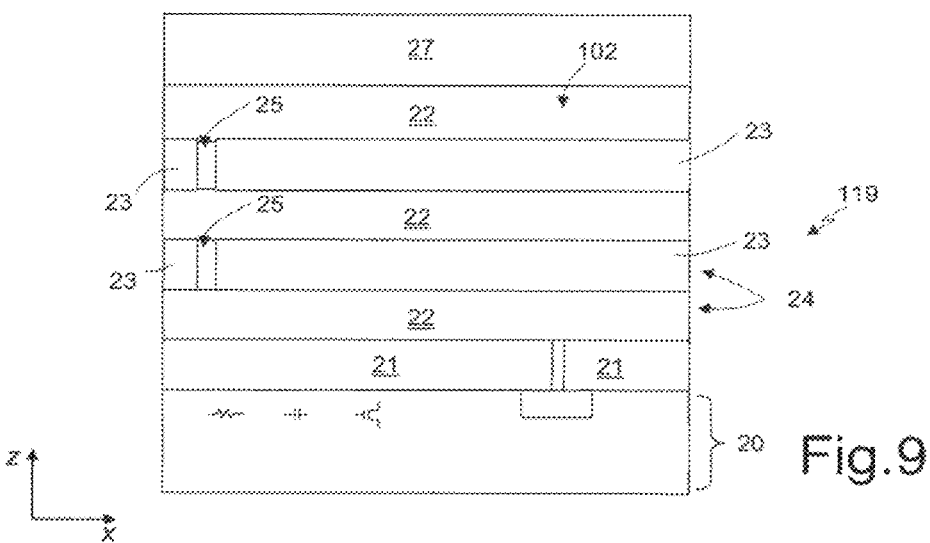
FIG. 9 shows a cross-section of an embodiment of the processing circuit of an RFID tag.

FIG. 9 shows a cross-section of an embodiment of a portion of a chip 119, which integrates the components of the processing circuit 103, represented schematically inside a substrate 20 of semiconductor material.

The thickness D1 of the substrate 20 of semiconductor material is typically between approximately 20 μm and 500 μm.

A ground shield 21, for example of polysilicon, is deposited over the substrate 20 and has the purpose of increasing the electrical resistance between the substrate 20 and the overlying layers, thus limiting the presence of parasitic currents (also referred to as "eddy currents"), which could deteriorate the performance of the RFID tag 100.

A series of layer pairs 24, each comprising a metallization layer 22 and a silicon-oxide layer 23, extend on top of the ground shield 21.

The metallization layers 22 are coupled together through vias 25. The metallization layer 22 of the top layer pair 24 forms the first antenna 102 of the RFID tag 100 and is covered by a passivation layer 27.

The use of a plurality of metallization layers 22 has the purpose of reducing the series resistance of the first antenna 102 of the RFID tag 100, improving the performance in terms of maximum coupling distance between the first antenna 102 and the receiving antenna 110.

Experiments have shown that the best performance of an embodiment of the first antenna 102 is obtained when the distance between the top metallization layer 22 and the substrate 20 of semiconductor material is between approximately 2.5 and 5 times the thickness of the metallization layers 22 (assuming that all of the layers 22 have approximately the same thickness).

Figures 10, 11:
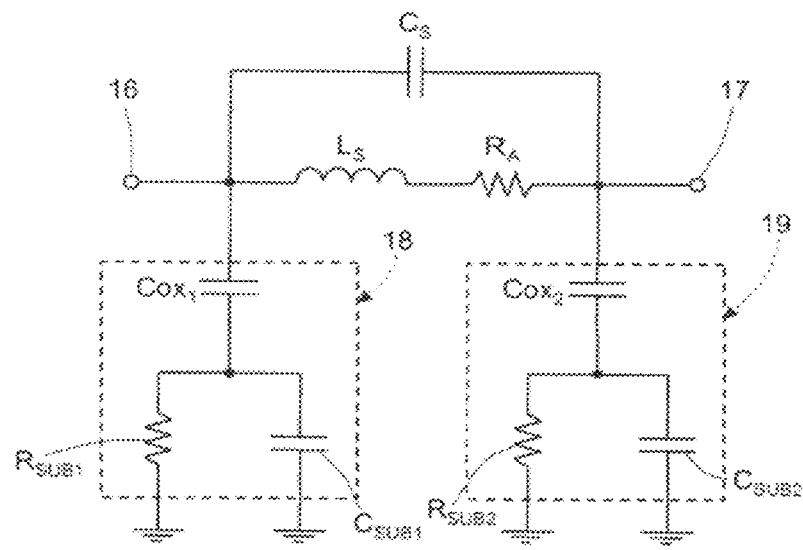
FIG. 10 shows a circuit model of the antenna of FIG. 8.
FIG. 11 is a table representing the plot of some design parameters of an embodiment of the antenna of FIG. 8.

FIG. 10 shows a concentrated-parameter model of the first antenna 102, according to the embodiment of FIG. 8. Here, the first antenna 102 is represented by an inductor Ls (representing the coupling inductance) and a resistor Ra (representing the series resistance of the first antenna 102) and has antenna terminals 16, 17 coupled to a capacitor Cs, which represents the parasitic coupling capacitance between the turns of the first antenna 102.

Each of the antenna terminals 16, 17 is coupled to a respective modelling circuit 18, 19, which takes into account the capacitances and resistances existing in the insulating regions and in the semiconductor material regions of the substrate 20. The modelling circuits 18, 19 are formed by respective insulation capacitors Cox1, Cox2, of respective substrate resistors Rsub1, Rsub2 and of respective substrate capacitors Csub1, Csub2. In detail, each insulation capacitor Cox1, Cox2 has a first terminal coupled to the respective antenna terminal 17, 18 and a second terminal coupled to a parallel circuit formed by the respective substrate resistor Rsub1, Rsub2 and by the respective substrate capacitor Csub1, Csub2. The substrate resistors Rsub1 and Rsub2 and the substrate capacitors Csub1, Csub2 are directly connected to ground. The quality factor of the antenna 102 of the embodiment of FIG. 8 is given by $$Q = \frac{\omega L_s}{R_A} \quad (7)$$

while the self-resonance frequency $f_{SR}$ of the turns forming the first antenna 102 of the embodiment of FIG. 8 is given by $$f_{SR} = \frac{1}{2\pi\sqrt{L_s C_{equ}}} \quad (8)$$

where $C_{equ}$ is an equivalent capacitance that is a function of the insulation capacitances Cox1 and Cox2, of the substrate capacitances Csub1 and Csub2, and of the capacitance Cs.

It may be demonstrated that the optimal coupling between the RFID tag 100 and an embodiment of the reader 104 is given by the design yielding the maximum value of the product $\omega Q L_s$. This is obtained using the maximum number of turns forming the first antenna 102, separated from one another by the minimum distance possible, and the maximum diameter of the turns, compatibly with the limits set by the self-resonance frequency and by the area of the first antenna 102. FIG. 11 shows how the performance in terms of Q, $L_s$, $f_{SR}$, varies as the geometry of the turns forming the first antenna 102 varies.

Figure 12:
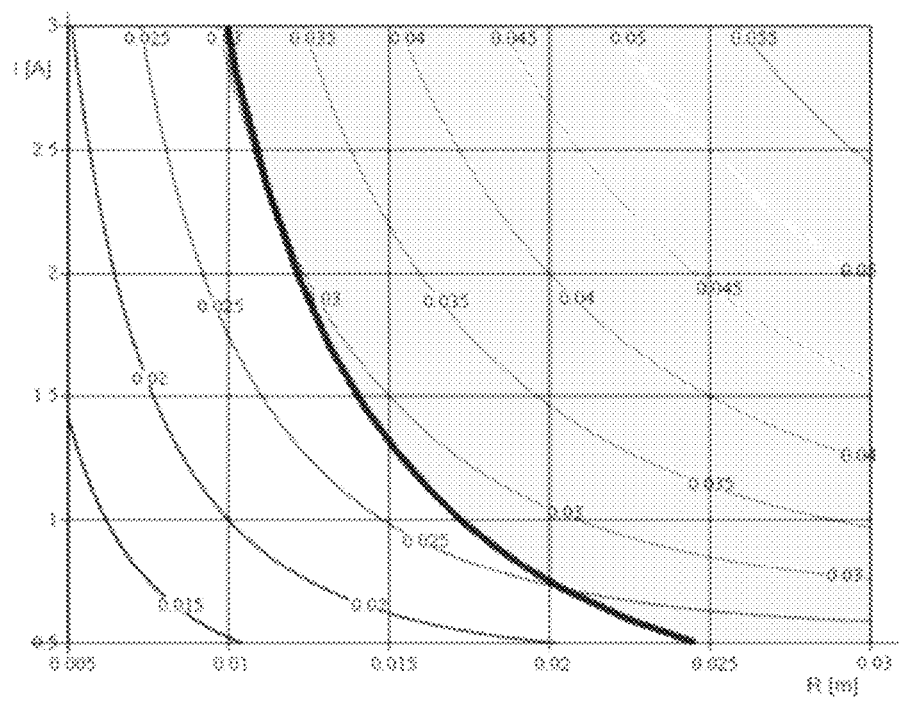
FIG. 12 shows some level curves corresponding to the maximum coupling distance between the transmitting antenna and the receiving antenna according to an embodiment.

FIG. 12 shows, instead, the curves of reading range, where the radius R of an embodiment of the second antenna 110 of the reader 104 is represented on the abscissa, the electrical current $i_1$ that flows in the coil L1 of the reader 104 is represented on the ordinates, and the curves are identified by a label giving the maximum reading range. The relation between the maximum current $I_{max}$ that may flow in the coil L1 of the reader 104 as a function of the radius of the coil L1 itself is given by the following relation:

$$I_{max} = \left(\frac{1}{KRa}\right)\sqrt{\frac{12W_{max}}{\pi\eta}} \quad (9)$$

where $K=\omega/c$ and $\eta=\sqrt{\omega/c}$, where $\omega$ is the pulsation of the signal in radians per second, Ra represents the series resistance of the first antenna 102, c is the speed of light in vacuum, and $W_{max}$ is the power of the transmitted signal, in this case equal to 1 W.

In FIG. 12, the grey area represents the reading ranges between the two antennas 102 and 110 that cannot be reached on account of typical limits set down by law on emission of electromagnetic fields by antennas in the free frequencies of scientific-medical use (ISM band).

Advantages of an embodiment of the described RFID tag 100 emerge clearly from the foregoing description. In particular, it is emphasized that the RFID tag 100 can operate in the UHF band in near-field conditions guaranteeing a high integration and including all the electronic circuits provided for its operation within the area delimited by the first spiral antenna 102, which is also integrated directly in the silicon chip 119.

Figure 13:
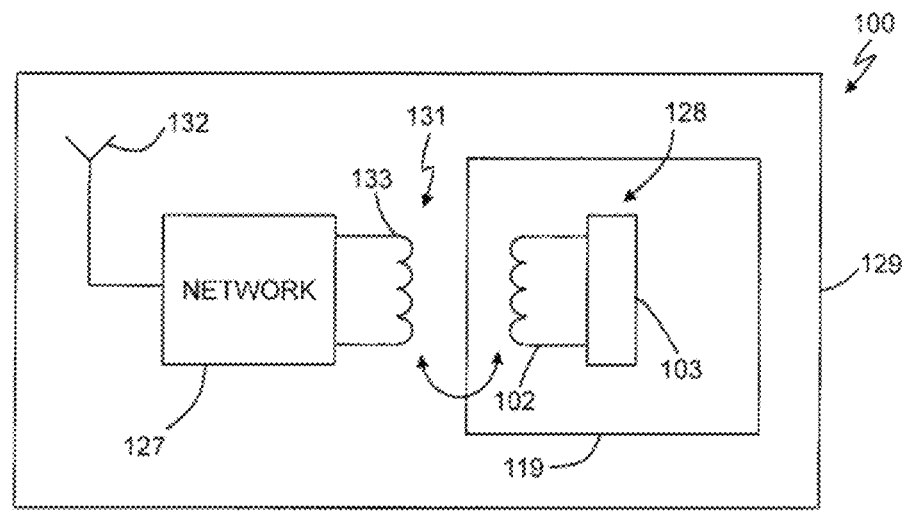
FIG. 13 shows an illustrative block diagram of a RFID TAG according to an embodiment.

According to a further embodiment, schematically shown in FIG. 13, the first antenna 102 is indirectly coupled with the second antenna 110 of the reader 104. In this embodiment, the first antenna 102 is formed by a secondary winding of a transformer 131, the primary winding 133 whereof is coupled to a third antenna 132 by means of an electrical network 127. The first antenna 102 is coupled to the processing circuit 103 through pads (not shown in FIG. 13) arranged on the chip 119. Moreover, the first antenna 102 forms, together with the processing circuit 103, an integrated circuit 128 which is integrated in the chip 119, in turn carried by a dielectric surface 129.

Figure 14:
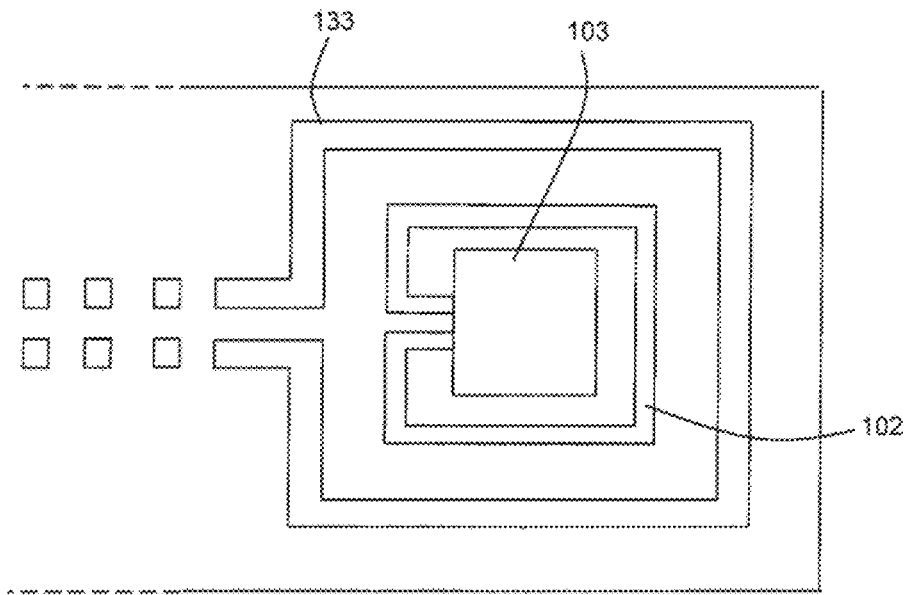
FIG. 14 a detail of a RFID TAG according to another embodiment.

The primary winding 133 of the transformer 131 forms a fourth antenna. In particular, according to the embodiment of FIG. 14, the primary winding 133 and the secondary winding 102 (forming the fourth and the first antenna) are implemented by loop antennas, the primary winding 133 being placed so as to surround the secondary winding 102. Both the primary winding 133 and the secondary winding 102 may be implemented by either a single-loop antenna or a multi-loop antenna. Furthermore, though not illustrated in any figure, antennas other than loop antennas (magnetic dipoles) may be used as primary and secondary windings.

In order to communicate through the first antenna 102, the integrated circuit 128 comprise a per se known transceiver (not shown) devoted to the management of data transmission through an antenna.

Figure 15A:
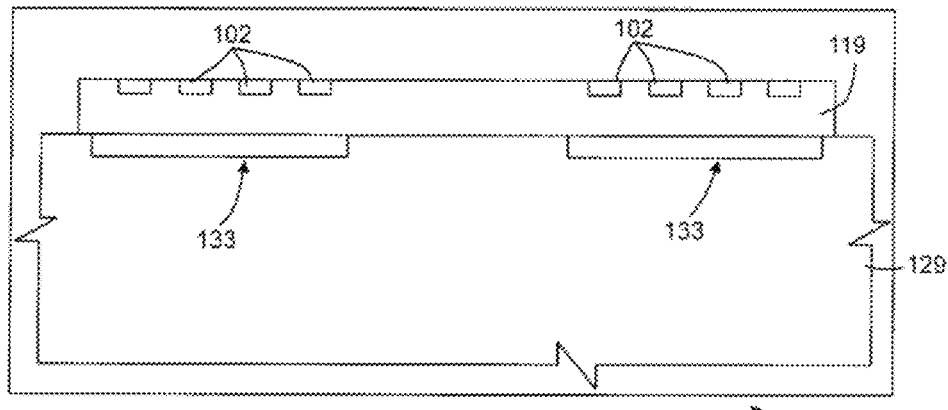
FIGS. 15a-15b show cross-sections of embodiments of an RFID TAG.

In order to improve the performances of the RFID tag 100, the fourth 133 and the first 102 antennas may be implemented as shown in the illustrative example of FIG. 15a, showing a section of a RFID TAG 100. According to this embodiment, the fourth antenna 133 is formed by a single metallic loop carried by the dielectric substrate 129, whereas the first antenna 102 comprises four loops and is integrated in the chip 119. Therefore, the first antenna 102 is arranged above the fourth antenna 133, so as to achieve a stacked geometry. This embodiment may lead to an improved coupling between the first and the fourth antennas 102, 133.

Figure 15B:
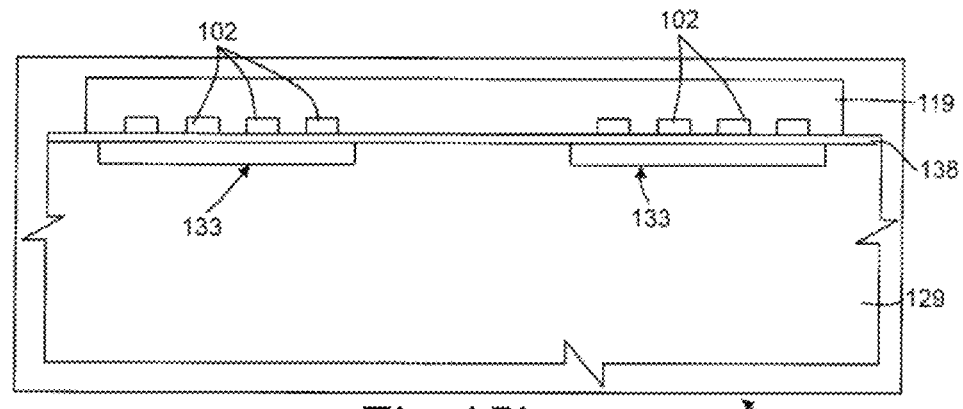

As shown in FIG. 15b, the stacked geometry may be obtained also using a face-to-face antenna assembly. In such a way, the first and the fourth antennas 102, 133 are arranged close to each other, thereby further improving the coupling. In order to prevent such antennas from directly contacting, a passivation layer 138 is interposed between the dielectric substrate 129 and the chip 119.

Figure 16:
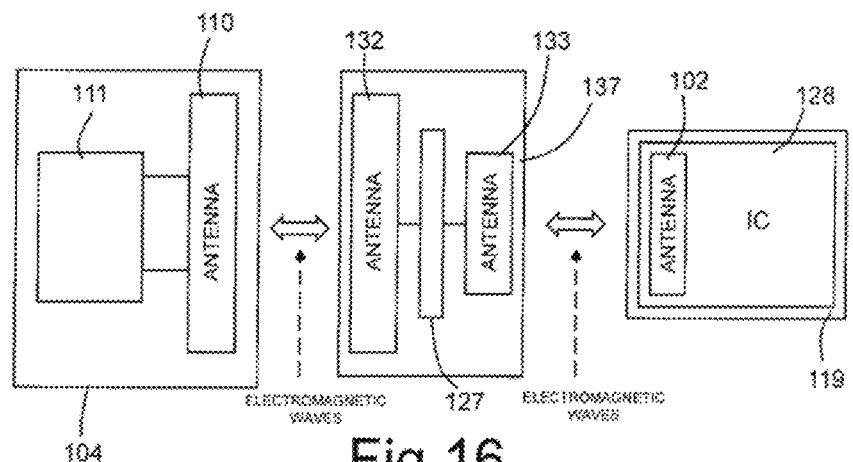
FIG. 16 shows a block diagram of an embodiment of a communication scheme between an external system, an electromagnetic expansion, and a generic integrated circuit.

The third antenna 132 may be a traditional antenna, such as a λ/2 dipole, a loop antenna, or multi-loop antenna. The third antenna 132, the electrical network 127 and the fourth antenna 133 form an electromagnetic expansion 137, as schematically illustrated in FIG. 16. Operatively, the electrical network 127 may be designed so that the electromagnetic expansion 137 resonates at a given frequency, in particular the operating frequency, discussed above.

In detail, the electrical network 127 may comprise a reactive element, such as an inductor or a capacitor, or a matching network. Such a reactive element is chosen so as to achieve a parallel or a series resonance, that is to make, respectively, the imaginary part of the admittance (parallel resonance) or of the impedance (series resonance) of the electromagnetic expansion 137 equal to approximately zero. Conversely, such a matching network is designed so as to match the impedances of the third antenna 132 and the fourth antenna 133, namely to have the impedance seen by the third antenna 132 at the operating frequency equal to the complex-conjugate of the impedance of the third antenna 132 itself.

The electrical network 127 depends on the expected use of the TAG RFID 100 and, in particular, on the expected working distance between the RFID TAG 100 and the reader 104: in case of distances shorter than one wavelength, namely in case of near field coupling, such a coupling is mainly inductive, thus the electrical network 127 comprises a capacitor connecting the third antenna 132 and the fourth antenna 133, so as to make the electromagnetic expansion 137 resonate as a series resonator at the operating frequency and maximizing the electrical current flowing in the first winding of the transformer (the fourth antenna 133); in case of distances longer than one wavelength, that is in case of far field coupling, the electrical network 127 comprises the above cited matching network, so as to maximize the power transfer from the third antenna 132 toward the RFID TAG 100.

In both cases (reactive element or matching network), the design may use known techniques, herein not reported.

Operatively, when receiving an incoming electromagnetic signal, the electromagnetic expansion 137 resonates, thereby reproducing (e.g. generating a replica of) the electromagnetic signal and focusing the corresponding electromagnetic field on the first antenna 102, improving the performances of the RFID TAG 100. As shown in the illustrative examples described hereinafter, there is no more need for electrically coupling the chip 119 with the third antenna 132, therefore there is no more need for bumps or wire bonds, traditionally used to supply the integrated circuits and to form a wired communication channel. Operatively, the electromagnetic expansion 137 acts so as to provide the integrated circuit 119 with a wireless communication channel, which may be used also to supply the integrated circuit 119.

Figure 17A:
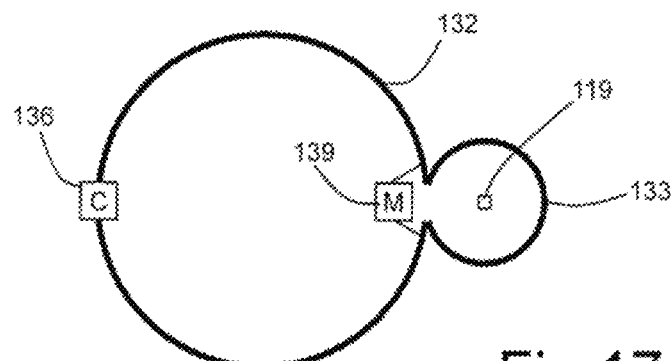

FIG. 17a shows an embodiment wherein the third 132 and the fourth 133 antenna are single-loop circular antennas, whereas the first antenna 102, enclosed within the fourth 133, is integrated on the chip 119 and, therefore, not shown. This embodiment further comprises a resonance capacitor 136 and, eventually, a matching network 139, both coupled to the third antenna 132.

Figure 17B:
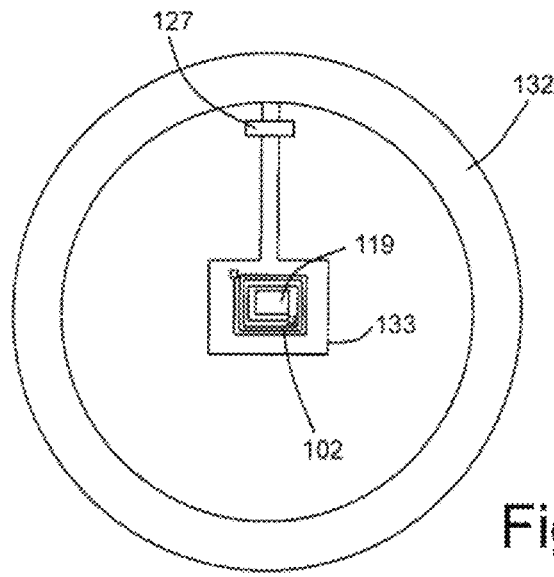

FIG. 17b shows an embodiment wherein the third antenna 132 is a coil antenna and contains the electrical network 127, in turn comprising either a capacitor or a matching network. The fourth 133 antenna is a single-loop square antenna, whereas the first antenna 102 is a multi-loop square antenna.

Figure 17C:
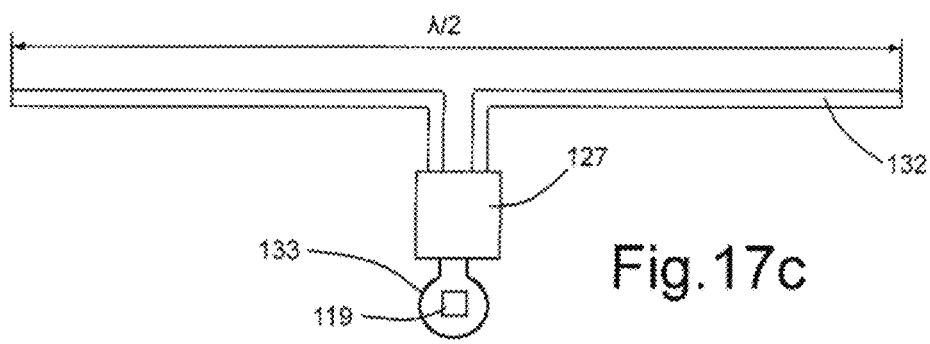

FIG. 17c shows a further embodiment wherein the third antenna 132 is a λ/2 dipole and is coupled to the electric network 127, in turn coupled to the fourth antenna 133, formed by a single-loop circular antenna and surrounding the chip 119; the first antenna 102 is not visible.

Figure 17D:
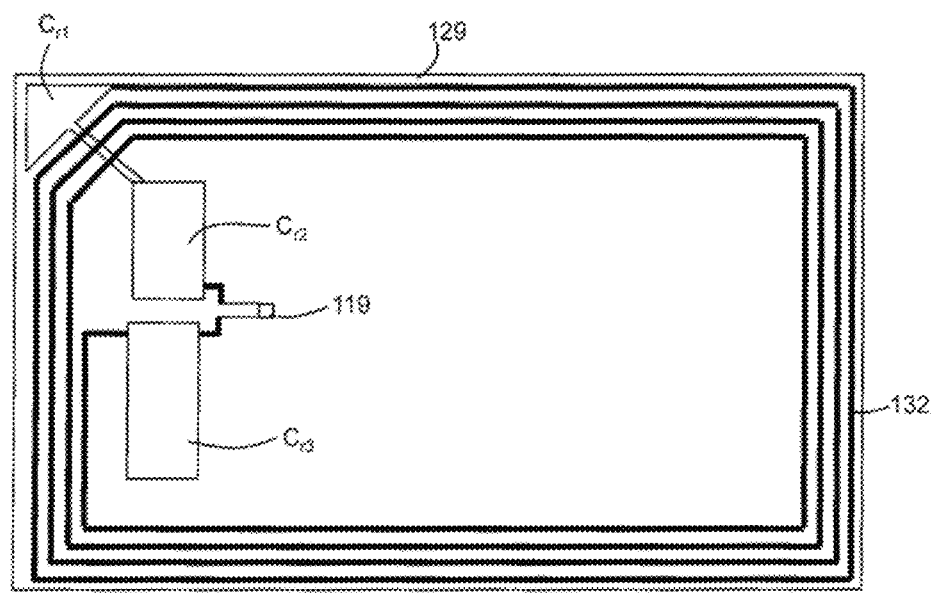

FIG. 17d shows an embodiment wherein the third antenna 132 is a multi-loop antenna, formed by a multi-loop metallic line placed on the upper face of the dielectric substrate 129. The electrical network 127 is made up of three capacitors $C_{r1}$, $C_{r2}$ and $C_{r3}$, each of them formed by a metallic stub orthogonally departing from the multi-loop metallic line and overlaying a corresponding metallic area placed on the lower face of the dielectric substrate 129; the three metallic areas are electrically coupled by means of metallic lines laying on the lower face of the dielectric substrate 129. The first and the fourth antennas are not shown.

FIG. 17e shows another embodiment, wherein the third 132 and the fourth 133 antenna are multi-loop antennas. In detail, the third antenna 132 is made up of three greater loops 132a, 132b, 132c, whereas the fourth antenna 133 is made up of three smaller loops 133a, 133b, 133c, each coupled to a corresponding greater loop 132a, 132b, 132c. Loops are made up of coplanar metallic lines, therefore, a first and a second crossover CR1, CR2 have been introduced, so as to connect an end of square loop 132a with an end of square loop 133c without contacting loops 132b and 132.

Figure 18:
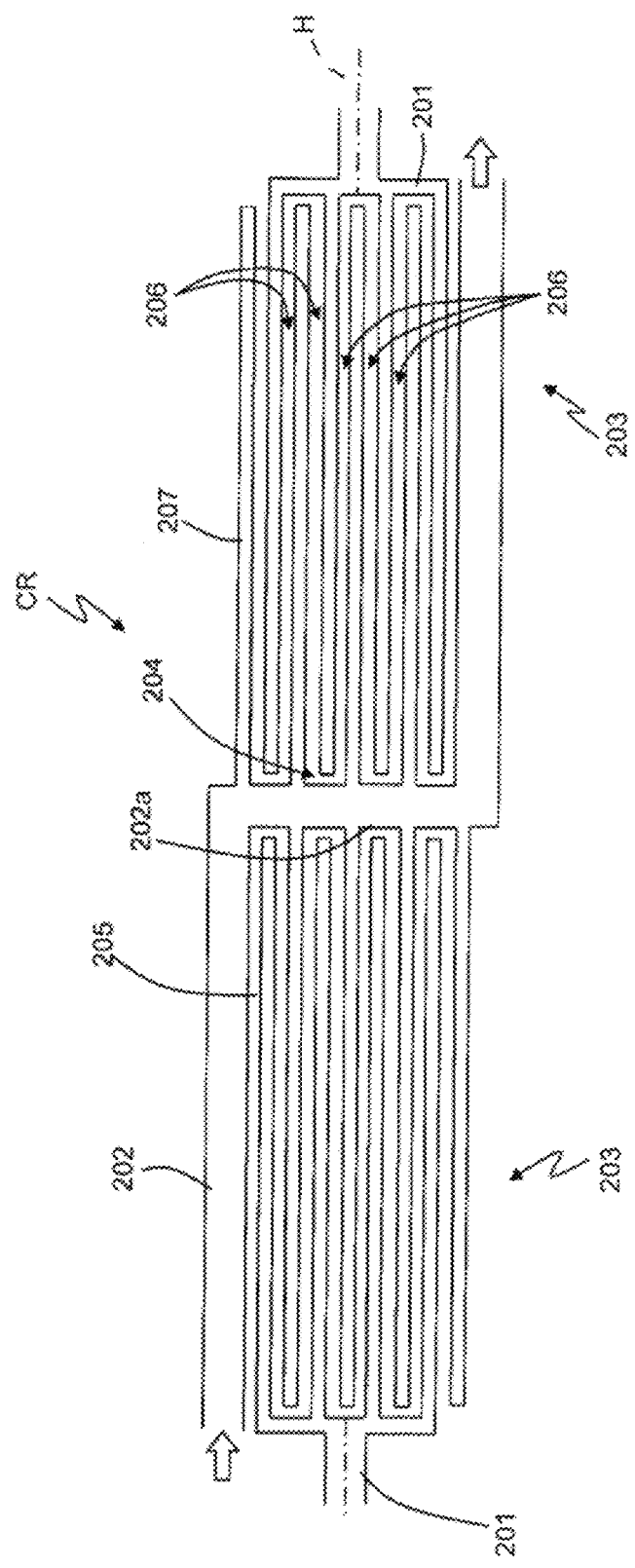
FIG. 18, shows a top plan view of a detail of an embodiment of a RFID TAG.

In detail, as shown in FIG. 18, an embodiment of a crossover CR between a first and second loop, namely between a first 201 and a second 202 metal line, may be obtained in the following manner. The first metal line 201 is interrupted so as to form two ends 203, separated by a main gap 204. Furthermore, each end 203 is formed by a plurality of tines 205, wherein each tine 205 on one end 203 is longitudinally aligned to a corresponding tine of the other end 203 but separated therefrom by the main gap 204; tines 205 of a same end 203 extend parallel to each other and define secondary gaps 206. The second metal line 202 has a transverse portion 202a extending through the main gap 204, for example orthogonally to the first metal line 201. Furthermore, the second metal line 202 has stubs 207 protruding from the transverse portion 202a and extending along the secondary gaps 206, thus interleaved with the tines 205. In such a way, the second loop is formed by a continuous metal line 202, whereas the first loop does not feature galvanic continuity and exploits the capacitive coupling between the facing ends 203 to connect them and allow the flow of alternate currents along the first loop.

The embodiments shown in FIGS. 17a-17e may be built up by means of cheap inkjet printing techniques employing single metallization layer roll-to-roll processes.

As shown in FIG. 16, the electromagnetic expansion 137 may be used to put in communication a generic external system (which may be different from the reader 104) not only with the chip 119 of the RFID TAG 100, but also with a generic integrated circuit 128, or a system-on-chip (SoC) 128, or a system in package (SiP), that is a package containing two or more integrated circuits.

Figure 19:
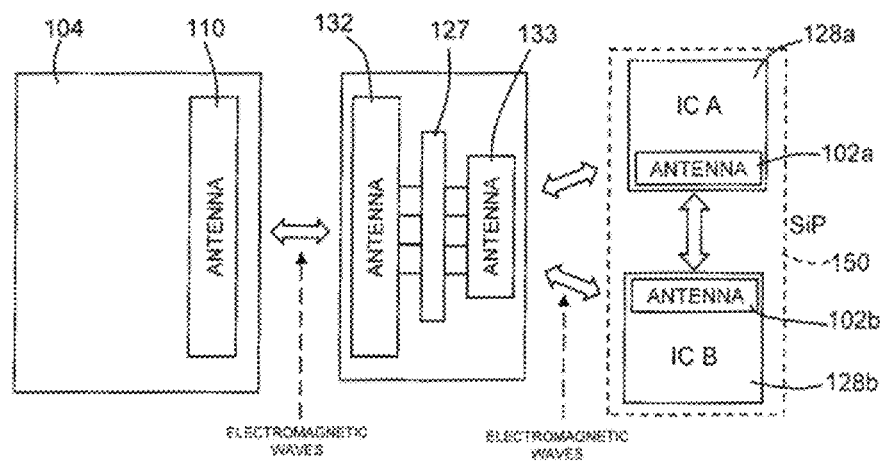
FIG. 19 shows a block diagram of an embodiment of a communication system.

As an example, FIG. 19 schematically shows an electromagnetic expansion 137, comprising the third antenna 132, the fourth antenna 133 and the electric network 127 as well, and communicating with the receiving antenna 110 of the external system and with a SiP 150. The SiP 150 comprises a first and a second integrated circuits 128a, 128b. Both the first and the second integrated circuit 128a, 128b are provided with a corresponding transceiver/transponder (not shown in FIG. 19) and coupled to corresponding first antennas, for the sake of clarity herein respectively indicated with 102a and 102b.

Figure 20A:
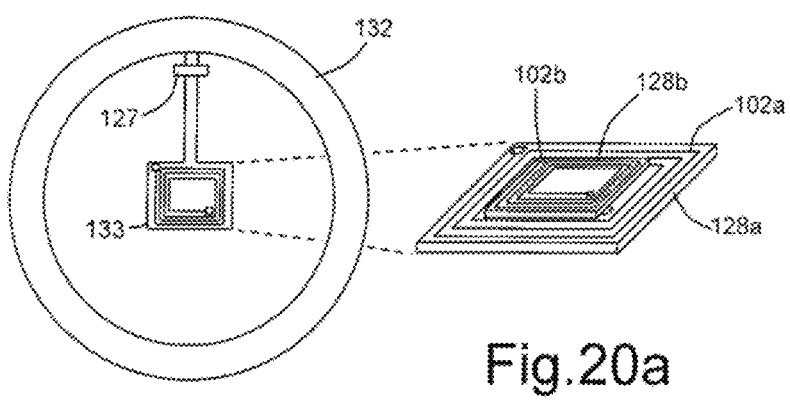
FIGS. 20a-20b show top plan views of embodiments of integrated circuit arrangements.
Figure 20B:
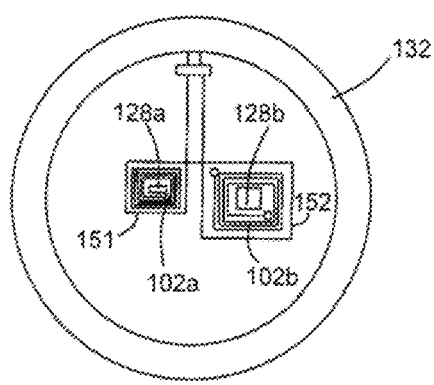
Figure 21A:
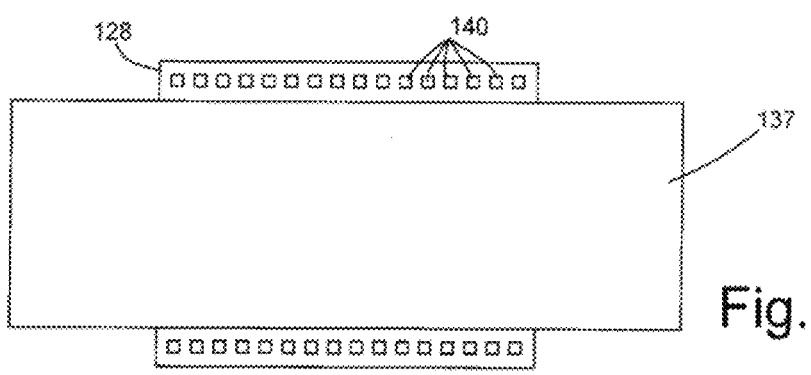
Figure 21B:
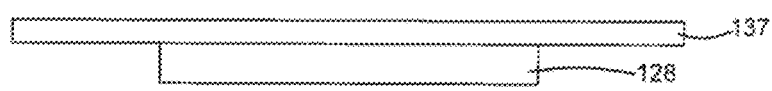
Figure 22A:
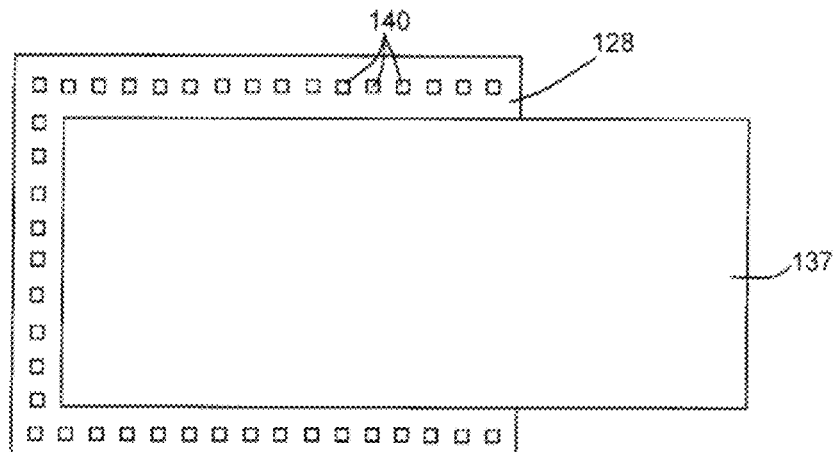
Figure 22B:
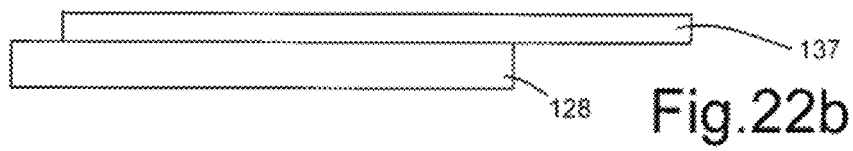
Figure 23A:
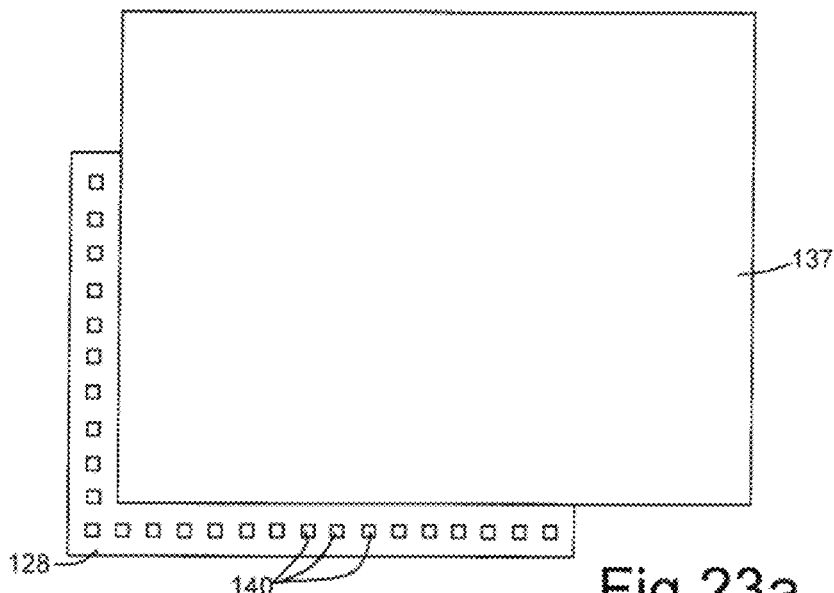
Figure 23B:
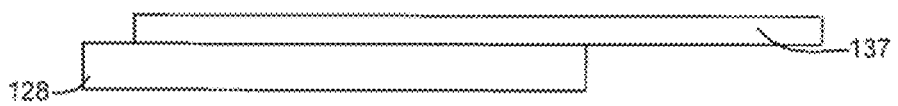
Figure 24A:
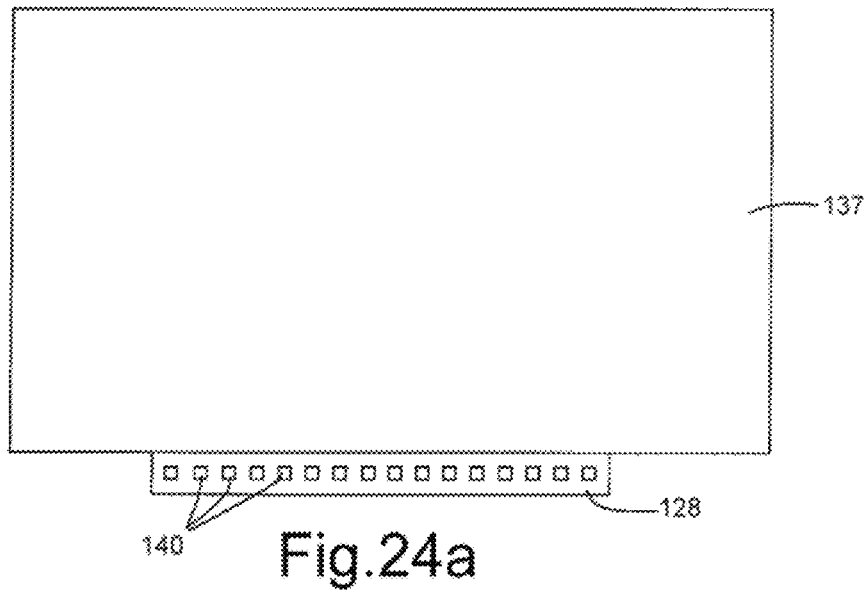
Figure 24B:
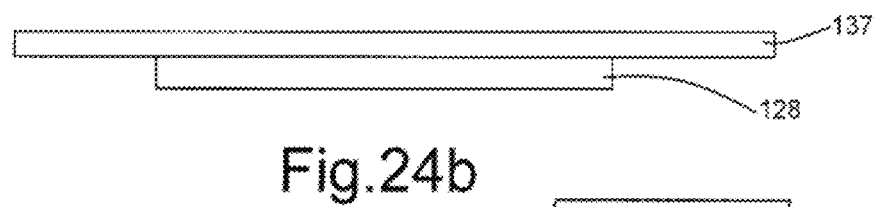
Figure 25A:
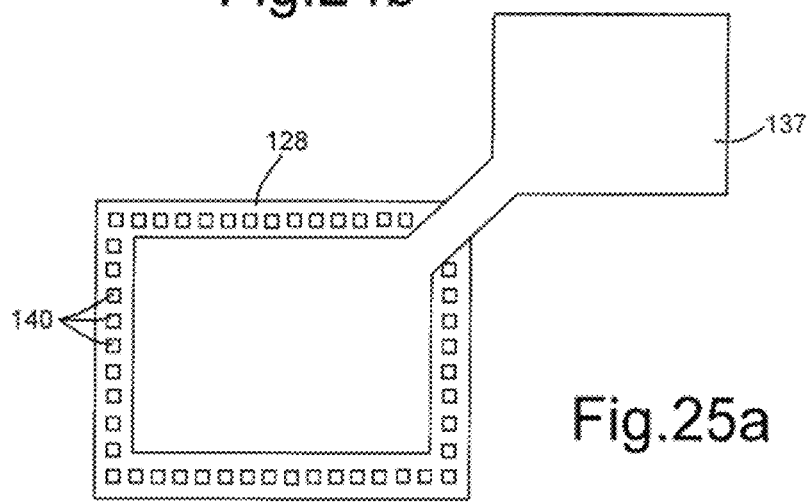
Figure 25B:
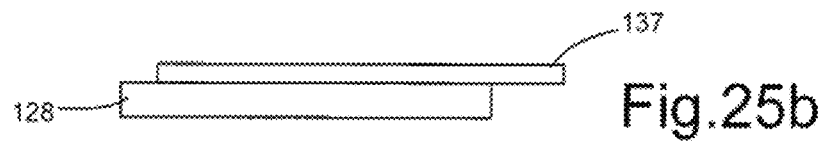
Figure 26A:
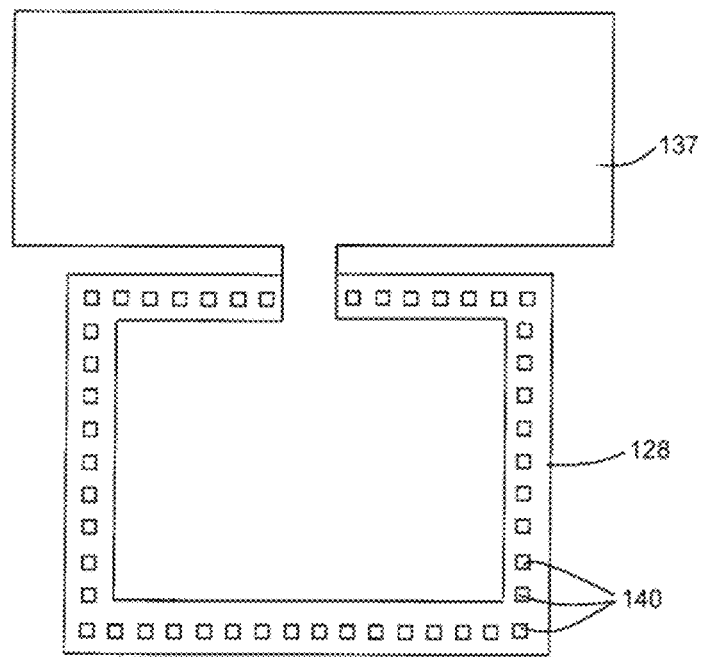
Figure 26B:
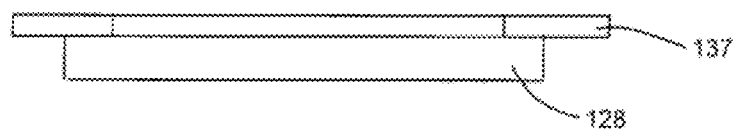

As shown in FIG. 20a and in the corresponding enlarged detail, the first and the second integrated circuits 128a, 128b may be superimposed on each other according to a stacked geometry, so as to optimize the coupling of the fourth antenna 133 with the first antennas 102a, 102b. Alternatively, the first and the second integrated circuit 128a, 128b may be arranged side by side, as shown in FIG. 20b. In this case, the electromagnetic expansion 137 comprises, besides the third antenna 132, two single-loop (magnetic dipoles) or coil antennas 151, 152 respectively placed all around the first and the second integrated circuits 128a, 128b, therefore all around the corresponding first antennas 102a, 102b.

The electromagnetic expansion 137 may be at least in part lodged within the SiP 150: as an example, the fourth antenna 133 (see FIG. 19) and/or the electrical network 127 may be lodged within the SiP 150; also the third antenna 132 may be lodged within the SiP 150.

According to another embodiment of the present disclosure, the one or more integrated circuits 128 may be additionally provided with a wired power supply, as well as with one or more wired communication channels. In particular, the third antenna 132 of the integrated circuit 128 and/or one or more power lines (not shown) may be directly connected to the integrated circuit 128 through pads 140 arranged on the chip 119.

In detail, FIGS. 21a-26a, 21b-26b illustrate integrated circuit-electromagnetic expansion arrangements. A glue layer (not shown) may be introduced between the chip 119 and the electromagnetic expansion(s) 137. The first antenna 102 and the processing circuit 103 are integrated in the chip 119 and thus are not visible.

Figure 27:
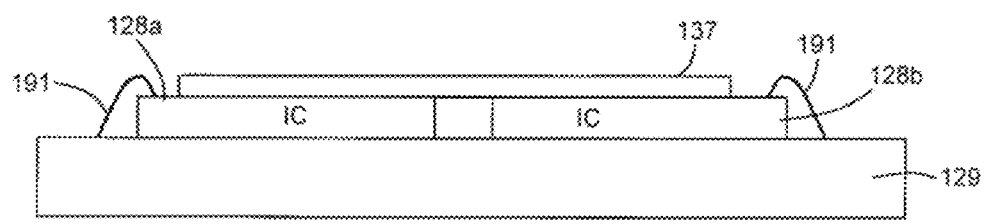
FIGS. 27, 28 show lateral views of embodiments of chip-electromagnetic expansion assemblies.
Figure 28:
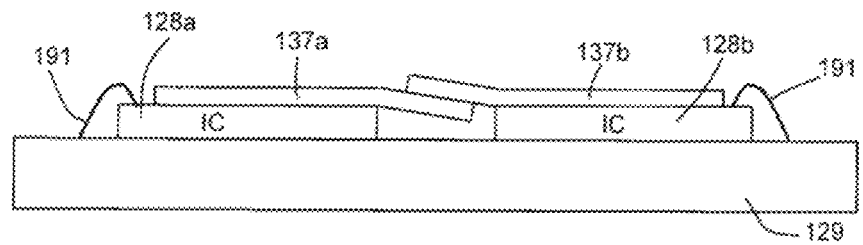

In case of two integrated circuits 128a, 128b, the electromagnetic expansion 137 may overlay both of them, as shown in FIG. 27, wherein the integrated circuits 128a, 128b are further coupled to wire bonds 191 forming corresponding wired supplies. Otherwise, each integrated circuit 128a, 128b, carried by the dielectric support 129, may be provided with corresponding electromagnetic expansions, herein indicated with 137a and 137b, as shown in FIG. 28. In particular, the electromagnetic expansions 137a, 137b may be carried by a respective flexible support, so as to allow a partial overlapping thereof, as schematically shown in FIG. 28.

In both FIGS. 27 and 28, the integrated circuits 128a, 128b are coplanar and are bonded to a main surface of the dielectric substrate 129.

Figure 29:
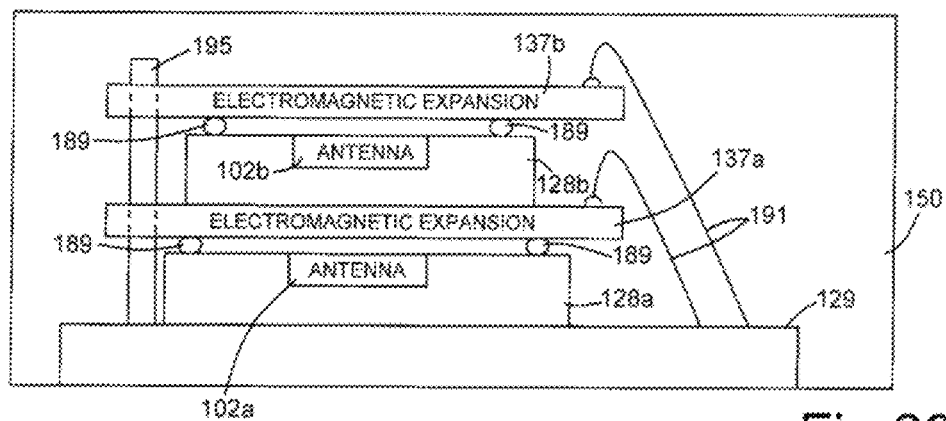
FIG. 29 shows an embodiment of a lateral section of a system-in-package.

According to another embodiment of the present disclosure, shown in FIG. 29, electromagnetic expansions are used to allow the communication between at least two integrated circuits 128a, 128b, for example belonging to a same SiP 150. Within the SiP 150, the integrated circuit 128a is arranged on top of the dielectric support 129 and is overlaid by a first electromagnetic expansion 137a, electrically coupled to the first integrated circuit 128a through bumps 189 or wire bonds 191; the second integrated circuit 128b extends above the first electromagnetic expansion 137a and is in turn overlaid by a second electromagnetic expansion 137b, coupled to the second integrated circuit 128b through bumps 189; in case, spacer layers (not shown) may be located between the electromagnetic expansions 137a, 137b. Alternatively, instead of wire bonds, it is possible to use through silicon vias (TSV), so as to create wired channels between integrated circuits. Though not shown, different arrangements are possible: as an example, the integrated circuit 128b may be arranged in a face-to-face geometry with respect to the integrated circuit 128a, the electromagnetic expansion 137a being interposed between these integrated circuits, thereby being shared between the integrated circuits 128a, 128b; according to this embodiment, the electromagnetic expansion 137b is no more present.

Each of the integrated circuits 128a, 128b comprises a first antenna, herein indicated as 102a and 102b. Furthermore, the two electromagnetic expansions 137a, 137b are electrically coupled, through wire bonds 191, to further components and/or circuits (not shown) carried by the dielectric support 129. The bumps 189, as well as the wire bonds 191, are optional: when present, bumps 189 and wire bonds 191 form, along with the electromagnetic expansions 137a and 137b, wired power supplies and/or wired communication channels available to the integrated circuits 128a, 128b.

In order to improve the electromagnetic coupling between the electromagnetic expansions 137a, 137b, a magnetic core 195 (FIG. 30), e.g. a ferrite core may be provided for and protrudes outside the package of the SiP 150 so as to allow sensing of the electromagnetic field inside the package from the outside of the package.

Figure 30:
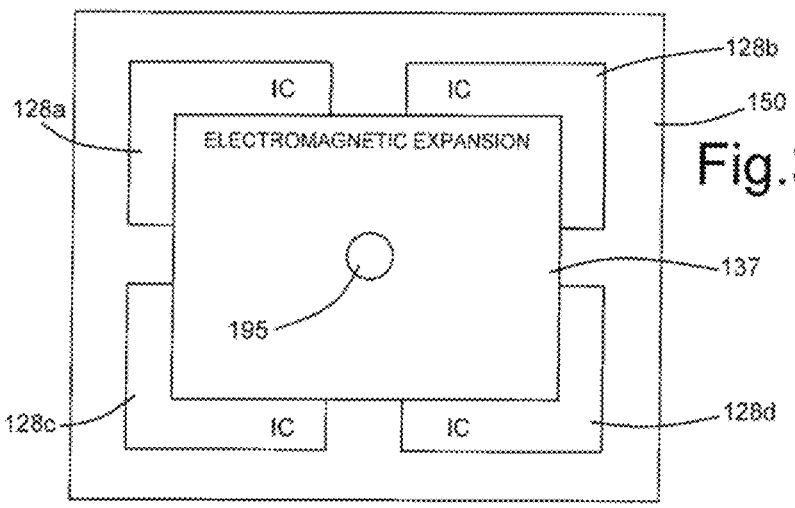
FIG. 30 shows as top plan view of an embodiment of a device formed by four integrated circuits.

In a different embodiment, shown in FIG. 30, four integrated circuits 128a, 128b, 128c, 128d, contained in the SiP 150, are coplanar and share a magnetic core 195 and an electromagnetic expansion 137. The electromagnetic expansion 137 overlaps partially each integrated circuit 128a-128d and comprises an antenna (not shown) to communicate with external devices (therefore acting as a third antenna 132) and four further antennas (not shown), each acting as a fourth antenna toward a corresponding integrated circuit 128a, 128b, 128c, 128d. The magnetic core 195 may be integral with the SiP 150 or may be removable.

Figure 31:
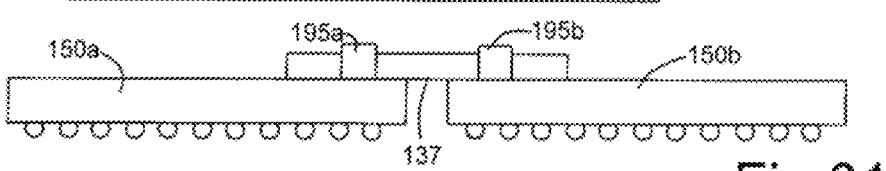
FIGS. 31 and 32 are cross-sections of embodiments of SiP assemblies.
Figure 32:
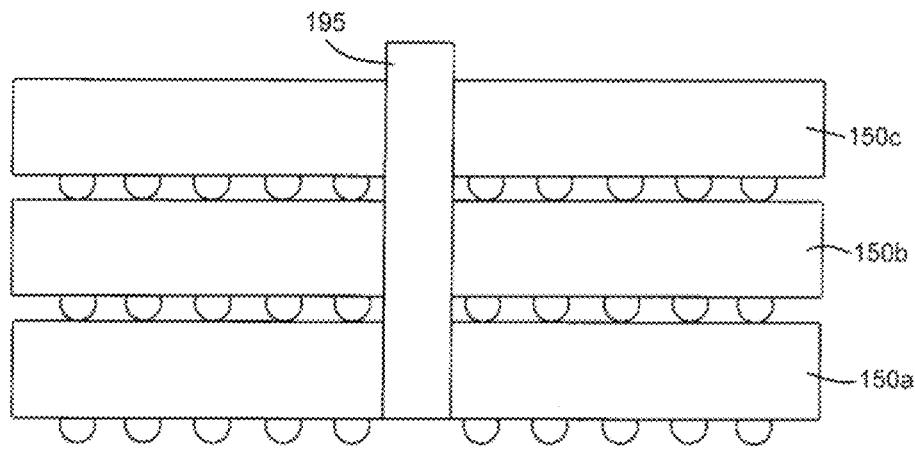

As shown in FIG. 31, two SiPs 150a, 150b are arranged in a coplanar way and may be coupled to each other by means of corresponding magnetic cores 195a, 195b and an electromagnetic expansion 137. In detail, the magnetic cores 195a, 195 protrude from the respective SiPs 150a, 150b so as to engage the electromagnetic expansion 137, which partially overlaps both the SiPs 150a, 150b. Alternatively, two or more SiPs may be stacked up, as shown in FIG. 32, wherein three SiPs 150a, 150b and 150bc share a magnetic core 195, so as to create a common wireless communication channel.

Figure 33:
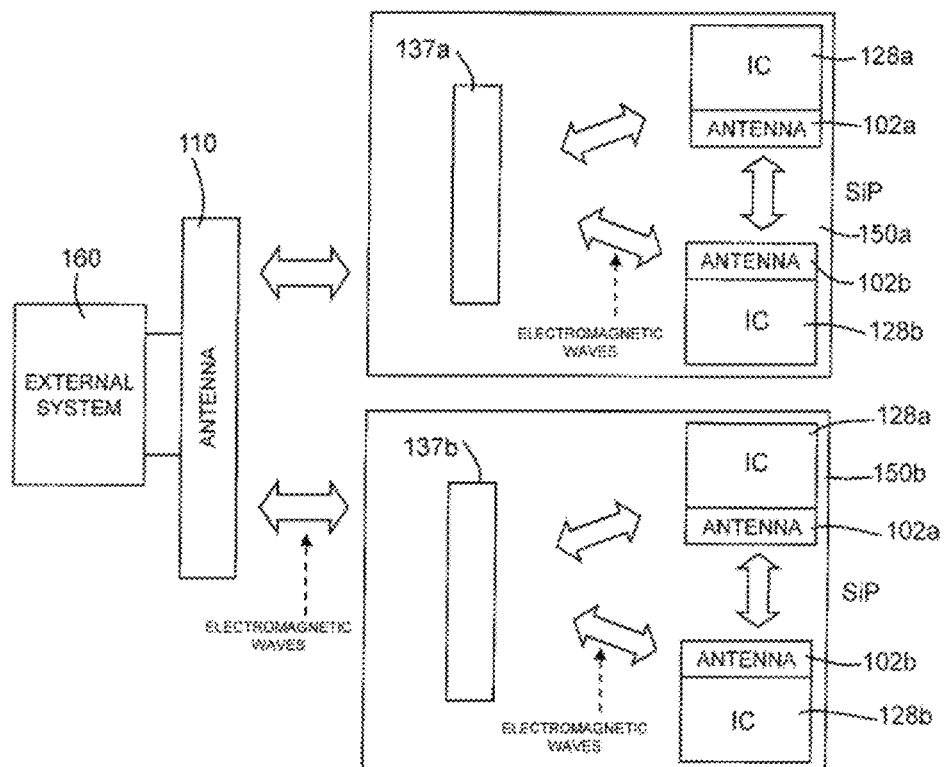
FIGS. 33 and 34 are block diagrams of embodiments of communication systems.
Figure 34:
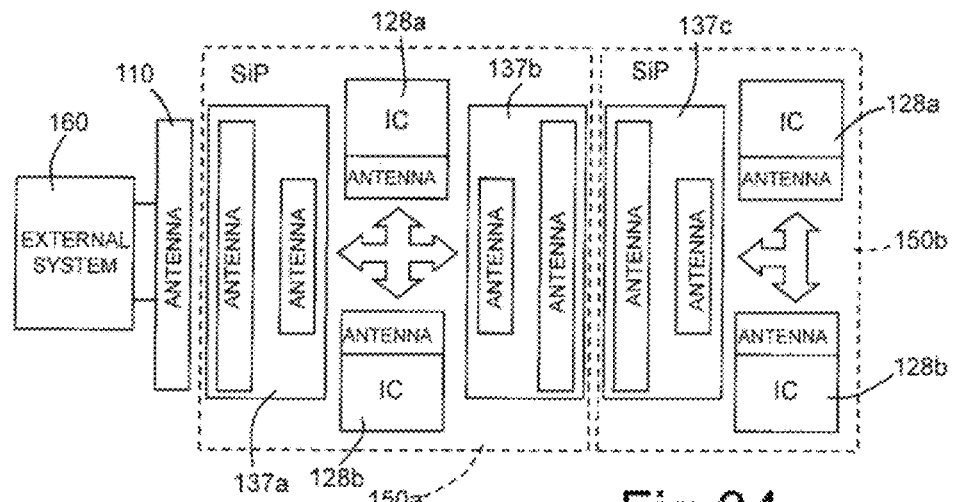

Finally, as shown in FIG. 33, two SiPs 150a, 150b, each containing a corresponding electromagnetic expansion 137a, 137b, two integrated circuits 128a, 128b and two corresponding first antennas 102a, 102b, may communicate with an external device 160 having a receiving antenna 110. As shown in FIG. 34, a first SiP, here SiP 150a, may comprise more than one electromagnetic expansion 137a, 137b, so that it may act as a repeater located between the external device 160 and a second SiP 150b, in turn comprising one or more integrated circuits and at least one electromagnetic expansion 137c. From another point of view, the SiP 150a may represent a master SiP, the slave SiP being represented by the SiP 150b, which may be used to provide the master SiP 150a with additional functionalities.

According to another embodiment of the present disclosure, electromagnetic expansions may be advantageously used as an interface between a piece of automatic test equipment (ATE) and a plurality of integrated circuits on a wafer, the piece of automatic test equipment being any automated device used for testing integrated circuits, printed circuit boards or the like. Traditionally, such automatic test equipment is coupled to the devices under test by means of sophisticated probe systems.

Figure 35:
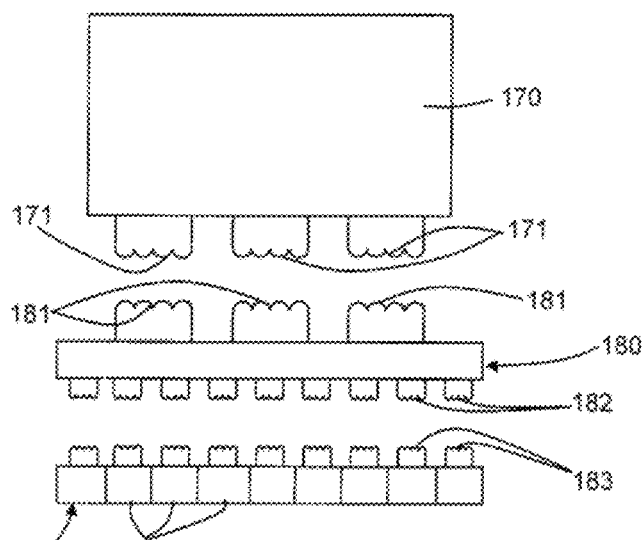
FIG. 35 is an illustrative view showing a possible cooperation among a semiconductor wafer, a probe card and a piece of automatic test equipment.
Figure 36:
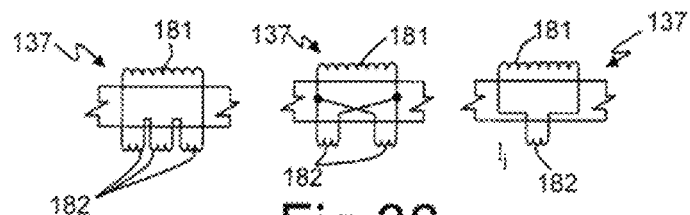
FIG. 36 shows details of an embodiment of the probe card of FIG. 35.

As shown in FIG. 35, the piece of automatic test equipment 170 has a number of inductive loops 171, so that it may be coupled, in use, with a probe card 180, in turn comprising a plurality of electromagnetic expansions. In detail, the probe card 180 has a first array of loops 181 and a second array of loops 182. During testing, the loops 181 are magnetically coupled to corresponding inductive loops 171 of the automatic test equipment 170, and the second loops 182 are magnetically coupled to embedded antennas 183, corresponding to the first antennas 102, 102a, 102b of FIGS. 5-34 and integrated in a wafer 190, accommodating also integrated circuits 128. The first and the second loops 181, 182 may be coupled in a per se known way so as to form electromagnetic expansions 137, as shown in FIG. 36. Each electromagnetic expansion is therefore formed by at least two antennas; each antenna may be a generic dipole and may communicate at frequencies that are different from the frequencies of other antennas.

The probe card 180 allows testing of electronic integrated circuits 128 without the need for pads, traditionally used to connect the probe and the integrated circuits during the electric wafer testing (Electrical Wafer Sort, EWS). Furthermore, besides acting as wireless interface between the automatic test equipment 170 and the plurality of integrated circuits 128 on the wafer 190, the electromagnetic expansions may be used to supply the integrated circuits 119, in case the integrated circuits 119 are low power integrated circuits; otherwise the power is supplied by means of per se known probes. Further probes may be used also to provide the integrated circuits with signals such as clock signals or to create additional wired measurement channels.

Figure 37:
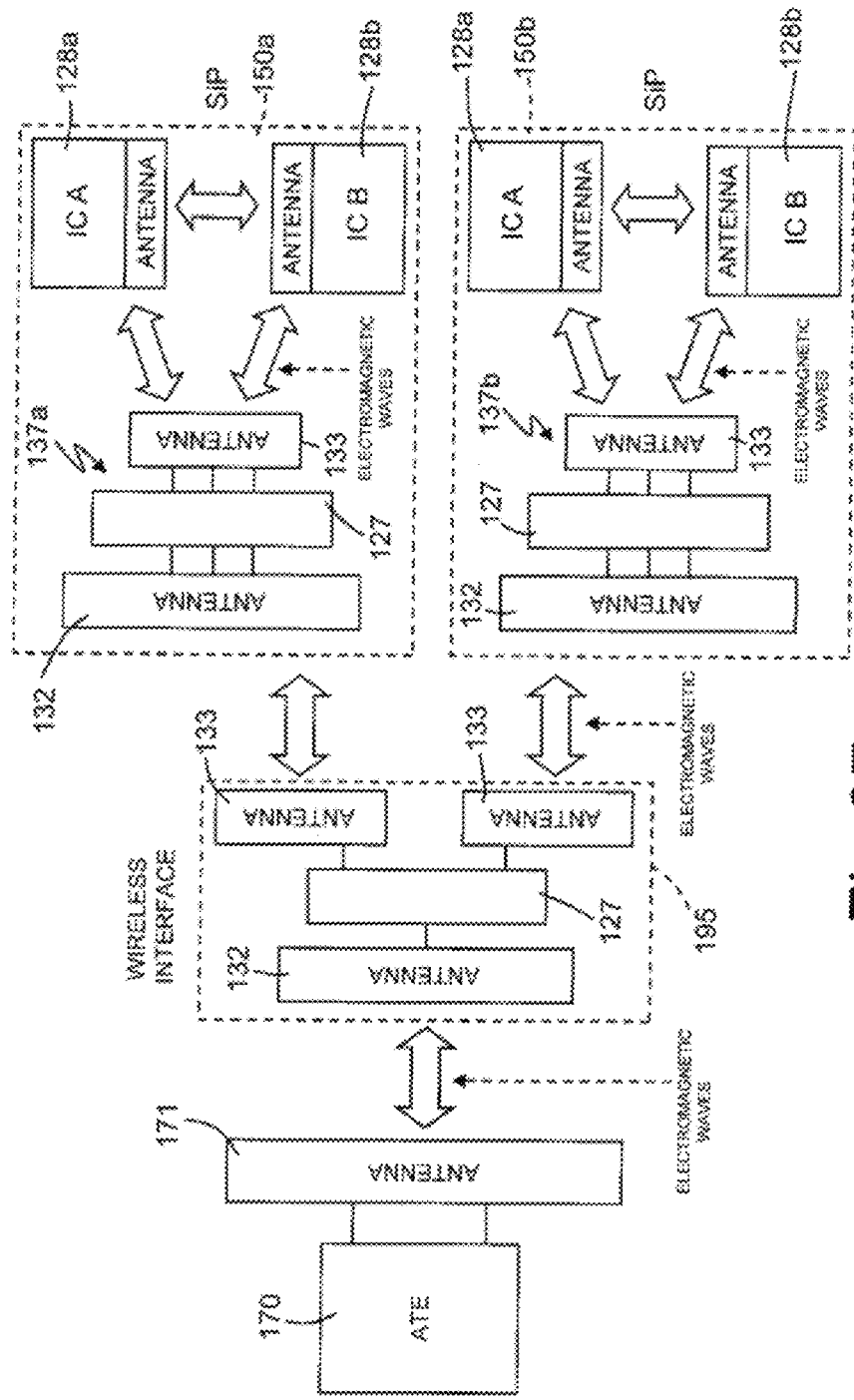
FIG. 37 shows a block diagram of an embodiment of a further communication scheme.

Analogously, a wireless interface 195 functionally equivalent to the described probe card 180 may be effectively used for testing packages or SiPs, as schematically shown in FIG. 37, each comprising a corresponding electromagnetic expansion 137a, 137b. Of course, each electromagnetic expansion 137 of the wireless interface 195 may communicate at a different frequency, namely communicate with a different frequency. Furthermore, in case of low power packages/SiPs, the wireless interface 195 supplies the packages and SiPs under test; otherwise, the wireless interface 195 may be additionally provided with wired power lines (not shown), so as to supply the SiPs and/or packages under test, as well as to have wired measurement channels.

Finally, it is clear that modifications and variations may be made to the embodiments of the RFID tag 100 described herein. In particular, the components of the integrated supporting circuit 103 may include transistors of a different type, for example bipolar transistors, the antennas may be of a dipole type, a single-coil or multi-coil square-loop or circular-loop type, or else again of a bent-dipole type, or of a patch type. Finally, the frequencies of operation of the RFID tag 100 may be different, in particular may be increased to meet a higher testing rate in the production stage. The transmitting antenna 102 and the processing circuit 103 may be mounted in planar or stacked configuration.

And the RFID TAG 100 (or another circuit using a similar communications interface) may be part of a larger system, such as a computer system and may be coupled to another integrated circuit, e.g., a controller, within the system. The TAG 100 and other circuit may be disposed on the same die or on different dies.

What is claimed is:

1. An RF device comprising a processing circuit, a first antenna, a substrate having upper and lower faces, and an electromagnetic expansion, said electromagnetic expansion comprising a third antenna, a fourth antenna and an electrical network connected to said third and fourth antennas; wherein said first antenna is configured to be magnetically or electromagnetically coupled to said fourth antenna and said third antenna is configured to be magnetically or electromagnetically coupled with a second antenna, the electromagnetic expansion being configured to generate a replica of each electromagnetic signal received by said third antenna; wherein the third and fourth antennas include conductive lines formed on the upper face of the substrate and at least one crossing point at which a first one of the conductive lines has an interruption point defining two facing ends, said facing ends being capacitively coupled, and the third and fourth antennas further include a second one of the conductive lines having a transverse connection portion extending between said facing ends of the first one of the conductive lines to provide a conductive electrical connection of a first segment of the second one of the conductive lines to a second segment of the second one of the conductive lines.

2. The RF device according to claim 1, wherein said electromagnetic expansion is configured to resonate in response to said each electromagnetic signal received by said third antenna.

3. The RF device according to claim 1, wherein said electrical network comprises a reactive element or a power matching network matching the impedances of said third and fourth antenna at a given operating frequency.

4. The RF device according to claim 3, wherein said first antenna and said fourth antenna are loop antennas, one of said first and fourth antennas surrounding another of said first and fourth antennas.

5. The RF device according to claim 4, wherein said first antenna and said fourth antenna are arranged in a stacked geometry.

6. The RF device according to claim 5, wherein said fourth antenna is formed on a substrate bonded to a die through an insulating layer, said first and fourth antenna facing each other and being electrically insulated by said insulating layer.

7. The RF device according to claim 4, further comprising a substrate having a surface, wherein said first antenna and said fourth antenna are bonded to said surface.

8. The RF device according to claim 4, wherein said third antenna is a $\lambda/2$ dipole or a loop antenna.

9. The RF device according to claim 4, wherein said third antenna and said fourth antenna are multi-loop antennas, each loop comprising a conductive line, at least a first and a second conductive line having reciprocal crossing points.

10. The RF device according to claim 1, wherein each of said facing ends have a comb-like shape including a plurality of tines, and said connection portion of said second line has stubs protruding from said connection portion and interleaved with said tines.

11. The RF device of claim 1, wherein the first conductive line has a longitudinal axis and wherein the transverse connection portion extends orthogonal to the longitudinal axis between the facing ends of the said first conductive line.

12. The RF device of claim 1, wherein the electromagnetic expansion further comprises a magnetic core.

13. The RF device of claim 12, wherein the RF device is contained in a package and wherein the magnetic core protrudes outside the package.

14. An RF system comprising an external system including a control circuit and a second antenna, a plurality of RF devices and a plurality of electromagnetic expansions, each RF device comprising a processing circuit and a first antenna, said first antenna and said processing circuit being integrated in a single chip in completely monolithic form; each electromagnetic expansion comprising a third antenna, a fourth antenna and an electrical network connected to said third and fourth antenna, wherein each third antenna is configured to be magnetically or electromagnetically coupled with said second antenna, each electromagnetic expansion being configured to generate a replica of each electromagnetic signal received by the corresponding third antenna and generated by the second antenna, and wherein the third and fourth antennas include at least one crossing point formed by two facing ends of a first conductive line formed on a first surface of the chip that are capacitively coupled and by a second conductive line formed on the first surface and having a conductive connection portion also formed on the first surface and extending between the facing ends of the first conductive line.

15. The RF system of claim 14 further comprising at least one magnetic core positioned to increase the electromagnetic coupling between the antennas on two or more of the plurality of electromagnetic expansions.

16. The RF system of claim 15, wherein at least two of the electromagnetic expansions are contained with a package and wherein the magnetic core includes a portion that protrudes outside the package to allow sensing from outside the package of electromagnetic signals communicated between the antennas one the at least two of the electromagnetic expansions.

\* \* \* \* \*